United States Patent
Yamagishi et al.

(10) Patent No.: US 9,401,712 B2
(45) Date of Patent: Jul. 26, 2016

(54) TOUCH PANEL SUBSTRATE WITH FIRST GRID ELECTRODES AND SECOND GRID ELECTRODES

(71) Applicant: Sharp Kabushiki Kaisha, Osaka (JP)

(72) Inventors: Shinji Yamagishi, Osaka (JP); Kazutoshi Kida, Osaka (JP); Hiromi Katoh, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 1 day.

(21) Appl. No.: 14/391,835

(22) PCT Filed: Apr. 15, 2013

(86) PCT No.: PCT/JP2013/061219
§ 371 (c)(1),
(2) Date: Oct. 10, 2014

(87) PCT Pub. No.: WO2013/157526
PCT Pub. Date: Oct. 24, 2013

(65) Prior Publication Data
US 2015/0077651 A1    Mar. 19, 2015

(30) Foreign Application Priority Data
Apr. 16, 2012  (JP) ................. 2012-093264

(51) Int. Cl.
*H03K 17/96* (2006.01)
*G06F 3/044* (2006.01)
*G06F 1/16* (2006.01)

(52) U.S. Cl.
CPC .......... *H03K 17/9622* (2013.01); *G06F 1/1643* (2013.01); *G06F 3/044* (2013.01); *G06F 2203/04112* (2013.01); *H03K 2017/9613* (2013.01); *H03K 2217/960755* (2013.01)

(58) Field of Classification Search
None
See application file for complete search history.

(56) References Cited

U.S. PATENT DOCUMENTS

2011/0102370 A1*  5/2011  Kono .................. G06F 3/044
                                                           345/174

FOREIGN PATENT DOCUMENTS

JP   2010-039537 A   2/2010
JP   2011-129501 A   6/2011

* cited by examiner

*Primary Examiner* — David D Davis
(74) *Attorney, Agent, or Firm* — Chen Yoshimura LLP

(57) ABSTRACT

Provided is a touch panel substrate to be used in a touch panel, the touch panel substrate having improved display qualities. A touch panel substrate of one embodiment of the present invention is provided with a first detection electrode having a plurality of first lattice electrodes that are aligned in the lateral direction. Each of the first lattice electrodes includes conductor lines formed in a lattice shape parallel to the outer shape of each of the first lattice electrodes, and in each of the first lattice electrodes, the diagonal line between the two opposing corners adjacent to first relay wiring is tilted with respect to the lateral direction.

13 Claims, 17 Drawing Sheets

(a)

Moiré Pattern Present

(b)

Moiré Pattern Absent

TOUCH PANEL SUBSTRATE WITH FIRST GRID ELECTRODES AND SECOND GRID ELECTRODES

TECHNICAL FIELD

The present invention relates to a touch panel substrate and a display device including the touch panel substrate.

BACKGROUND ART

In recent years, in order to achieve device miniaturization, display devices in which the display unit and the input unit are integrally formed are in wide use. In particular, display devices including touch panels that can detect a contact position where a finger or an input stylus (object to be detected) has come into contact with a display surface are in wide use in mobile devices such as mobile phones, PDAs (personal digital assistants), and laptop computers.

Touch panels of various types such as the conventional so-called resistive film (pressure-sensitive) type and capacitive type are known. Among these, touch panels of the capacitive type are in wide use.

In capacitive touch panels, a position of contact is detected by detecting changes in capacitance when a finger or an input stylus comes into contact with the display surface. Thus, it is possible to detect a contact position by a simple operation.

So-called sensor electrodes, which are position detection electrodes that detect a contact position of an object are often made of ITO (indium tin oxide) or the like. However, if the touch panel is large, then there is a problem that the resistance of the sensor electrodes made of ITO becomes large, and the detection sensitivity decreases.

Patent Documents 1 and 2 disclose configurations in which, in order to reduce resistance of the sensor electrodes, the sensor electrodes are made of metal wiring lines in a grid pattern. In order for the sensor electrodes extending in the vertical direction and sensor electrodes extending in the horizontal direction, each sensor electrode is constituted of a plurality of grid electrodes, each of which is formed into a square shape.

RELATED ART DOCUMENTS

Patent Documents

Patent Document 1: Japanese Patent Application Laid-Open Publication, "Japanese Patent Application Laid-Open Publication No. 2011-129501 (Published on Jun. 30, 2011)"

Patent Document 2: Japanese Patent Application Laid-Open Publication, "Japanese Patent Application Laid-Open Publication No. 2010-039537 (Published on Feb. 18, 2010)"

SUMMARY OF THE INVENTION

Problems to be Solved by the Invention

However, with the above-mentioned conventional configurations, the metal wiring lines in a grid pattern and the black matrix of the display panel interfere with each other, resulting in a moiré pattern sometimes appearing, resulting in deterioration in display quality.

Appearance of a moiré pattern is related to the pitch of the wiring lines formed in the touch panel and the pitch of the pixels (pitch of the black matrix) in the vertical direction and horizontal direction. The pitch of the black matrix depends on the size of the display panel, the arrangement of the pixels, and the like.

Also, the pitch of the sensor electrodes arranged in a matrix is determined as a specification depending on the size of the display panel and the desired performance (resolution). Once the pitch of the sensor electrodes is determined, the outer size of the grid electrodes of the sensor electrodes is also determined. The length of each side of the grid electrodes divided by the number of grid wiring lines is equal to the pitch of the grid (pitch of the wiring lines). However, there is a preferred range in the number of grid wiring lines from the perspective of performance (detection sensitivity), aperture ratio, and the like. Thus, the designer cannot freely decide the wiring line pitch. As a result, with the conventional configuration above, a moiré pattern sometimes appears.

The present invention takes into consideration this situation, and according to one aspect of the present invention, it is possible to attain a touch panel substrate used in a touch panel with improved display quality, and a display device including this.

Means for Solving the Problems

A touch panel substrate of the present invention includes: a first detection electrode having a plurality of first grid electrodes each having a quadrilateral outer shape, the first grid electrodes being arranged in a first direction. The touch panel further includes a second detection electrode having a plurality of second grid electrodes each having a quadrilateral outer shape, the second grid electrodes being arranged in a second direction differing from the first direction. Each of the first grid electrodes includes first conductive lines formed in a grid pattern such that sides of cells of the grid pattern are respectively parallel to sides of the quadrilateral outer shape of the first grid electrode. The first grid electrodes adjacent to each other in the first direction are electrically connected by a first relay wiring line formed therebetween. Each of the first grid electrodes has two opposing corners forming a diagonal line generally extending in the first direction but inclined with respect to the first direction. Each of the second grid electrodes includes second conductive lines formed in a grid pattern such that sides of cells of the grid pattern are respectively parallel to sides of the quadrilateral outer shape of the second grid electrode. The second grid electrodes adjacent to each other in the second direction are electrically connected by a second relay wiring line formed therebetween, and each of the second grid electrodes has two opposing corners forming a diagonal line generally extending in the second direction but inclined with respect to the second direction.

Effects of the Invention

Thus, by the touch panel substrate of the present invention, display quality can be improved by mitigating the appearance of a moiré pattern, and contact position can be appropriately detected.

DETAILED DESCRIPTION OF EMBODIMENTS

Embodiment 1

A display device having touch panel functionality of one embodiment of the present invention (hereinafter referred to as a display device) will be described below.

(Configuration of Display Device)

Figure 1:
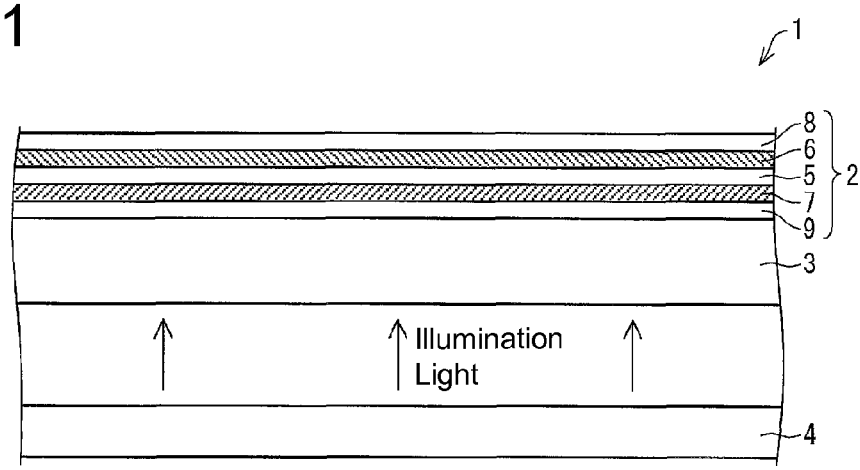
FIG. 1 is a cross-sectional view of a schematic configuration of a display device of one embodiment of the present invention.

FIG. 1 is a cross-sectional view of a schematic configuration of a display device of the present embodiment. A display device 1 of FIG. 1 includes a touch panel substrate 2, a display panel 3, respective driver circuits for driving the display panel 3 (data signal line driver circuit, scanning signal line driver circuit, etc.; not shown), and a backlight 4.

The display panel 3 is an active matrix-type liquid crystal display panel in which a liquid crystal layer is sandwiched between an active matrix substrate and a color filter substrate. The display panel 3 includes a black matrix (not shown) that delineates the respective pixels in a grid pattern. A typical display panel can be used for the display panel 3, and thus, detailed descriptions of the structure thereof will be omitted. For the display panel 3, it is possible to use not only a liquid crystal display panel, but also appropriate display panels such as organic EL displays.

The backlight 4 is provided on the rear side of the display panel 3, and radiates light to the display panel 3.

The touch panel substrate 2 is a capacitive touch panel substrate provided on the front side (user side) of the display panel 3. The touch panel substrate 2 includes a substrate 5, a first electrode layer 6, a second electrode layer 7, a first protective layer 8, and a second protective layer 9. The first electrode layer 6 is provided on the front side of the substrate 5 and the second electrode layer 7 is provided on the rear side of the substrate 5. The first protective layer 8 is provided on the front side of the first electrode layer 6. The second protective layer 9 is provided on the rear side of the second electrode layer 7.

The substrate 5 is made of a dielectric material, and can be made of glass, a plastic film, or the like, for example.

A plurality of first detection electrodes including low resistance conductive lines made of metal or the like are formed in the first electrode layer 6. The first detection electrodes extend in the same direction as the scan signal lines (horizontal direction; first direction).

A plurality of second detection electrodes including low resistance conductive lines made of metal or the like are formed in the second electrode layer 7. The second detection electrodes extend in a direction perpendicular to the direction of extension of the first detection electrodes (direction in which the data signal lines extend; vertical direction; second direction).

The first protective layer 8 is a surface with which an object to be detected comes into contact and can be made of a transparent insulator such as glass or a plastic film. Similarly, the second protective layer 9 can also be made of a transparent insulator such as glass or a plastic film. The second protective layer 9 is bonded onto the display panel 3.

A capacitance is formed between the first detection electrodes and the second detection electrodes. The capacitance changes when an object to be detected comes into contact with the surface of the touch panel substrate 2. By detecting changes in this capacitance, it is possible to determine where an object has come into contact. It is possible to determine the first detection electrode (row) and the second detection electrode (column) where the capacitance has changed by applying a driving voltage to the first detection electrodes and measuring the change in voltage in the second detection electrodes, for example. In such a case, the first detection electrodes are sometimes referred to as transmission electrodes and the second detection electrodes are sometimes referred to as reception electrodes. A known circuit can be used for the position detection circuit for detecting the coordinates of an object to be detected, and there are no special limitations therefor.

Comparison Example

First, the appearance of a moiré pattern when using a touch panel substrate 100 of a comparison example, and a method preventing this will be described.

Figure 18:
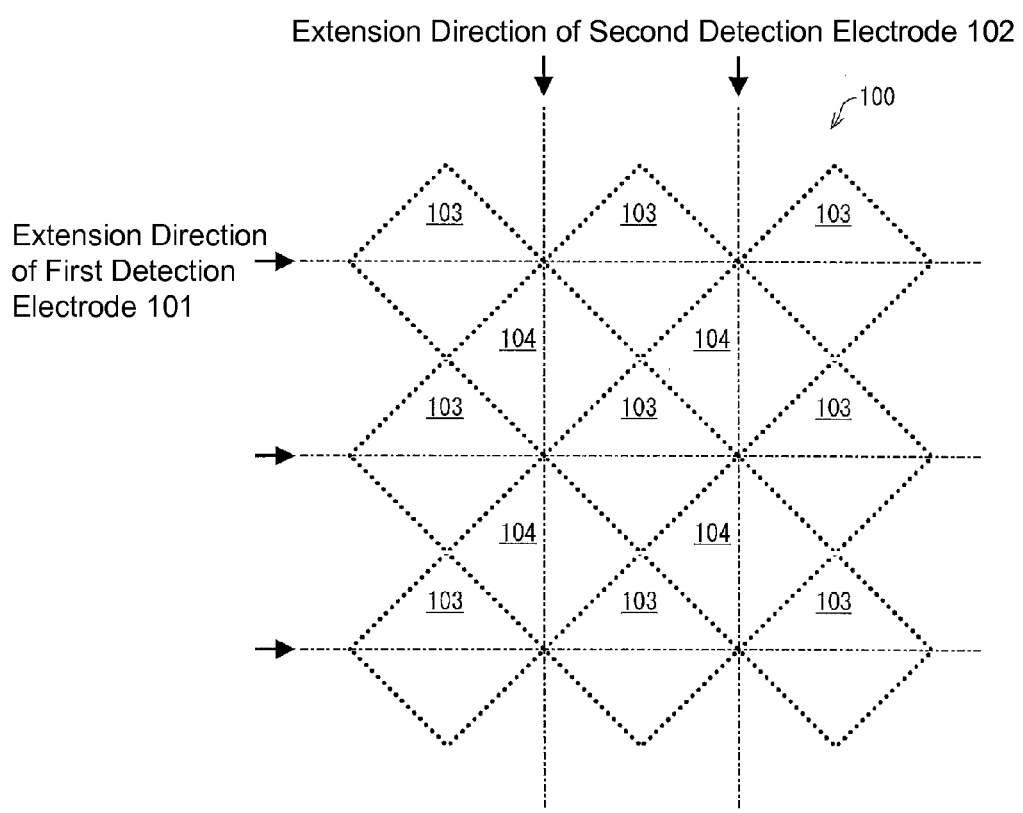
FIG. 18 is a plan view showing an arrangement of first detection electrodes and second detection electrodes in a touch panel substrate of a comparison example.

FIG. 18 is a plan view showing an arrangement of first detection electrodes 101 and second detection electrodes 102 in the touch panel substrate 100 of the comparison example. The touch panel substrate 100 has spread thereon a plurality of square-shaped first grid electrodes 103 and second grid electrodes 104. The first grid electrodes 103 and the second grid electrodes 104 are formed in different layers from each other.

The first grid electrodes 103 and the second grid electrodes 104 are formed of conductive lines in a grid pattern to form squares. Thus, light emitted from the display panel can pass through the touch panel substrate 100.

FIG. 18 does not show a detailed configuration of the first grid electrodes 103 and the second grid electrodes 104, but the plurality of first grid electrodes 103 arranged in the horizontal direction are electrically connected to each other. Each first detection electrode 101 has a plurality of first grid electrodes 103 arranged horizontally. The plurality of first detection electrodes 101 extending in the horizontal direction are arranged in the vertical direction.

Also, the plurality of second grid electrodes 104 arranged in the vertical direction are electrically connected to each other. Each second detection electrode 102 has a plurality of second grid electrodes 104 arranged vertically. The plurality of second detection electrodes 102 extending in the vertical direction are arranged in the horizontal direction.

Figure 19:
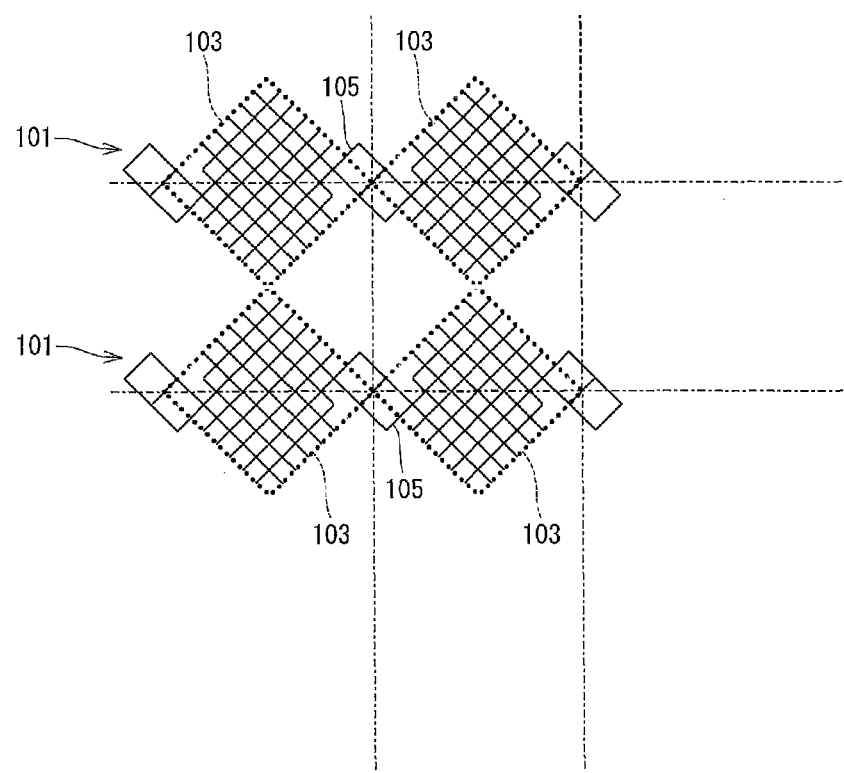
FIG. 19 is a plan view showing a detailed configuration of the first detection electrodes of the comparison example.

FIG. 19 is a plan view showing a detailed configuration of the first detection electrodes 101 of the comparison example.

Each of the first detection electrodes 101 extends in the horizontal direction and has a plurality of first grid electrodes 103. Relay wiring lines 105 made of a conductive line are provided between first grid electrodes 103 adjacent to each other in the horizontal direction. The adjacent first grid electrodes 103 are connected to each other through the relay wiring line 105. First grid electrodes 103 adjacent to each other in the vertical direction are separate from each other.

The conductive lines in the first grid electrodes 103 are formed in a grid pattern parallel to the other shape of the first grid electrodes 103. In other words, the conductive line grid is formed such that the respective conductive lines are parallel to the respective outer sides of the first grid electrodes 103. Here, the first grid electrodes 103 are in a square shape, and thus, the conductive lines are arranged in a square grid.

The first detection electrodes 101 extend in the horizontal direction, and thus, it is possible to detect that an object to be detected is located on a certain row.

The second detection electrodes 102 have a form in which the first detection electrodes 101 are rotated 90°. When the first detection electrodes 101 and the second detection electrodes 102 are layered together, conductive lines are arranged in a grid pattern over the entire touch panel substrate 100.

However, if the touch panel substrate 100 is disposed on the display panel 3, the conductive lines in a grid pattern and the black matrix of the display panel 3 interfere with each other, which can cause the appearance of a moiré pattern.

Figure 20:
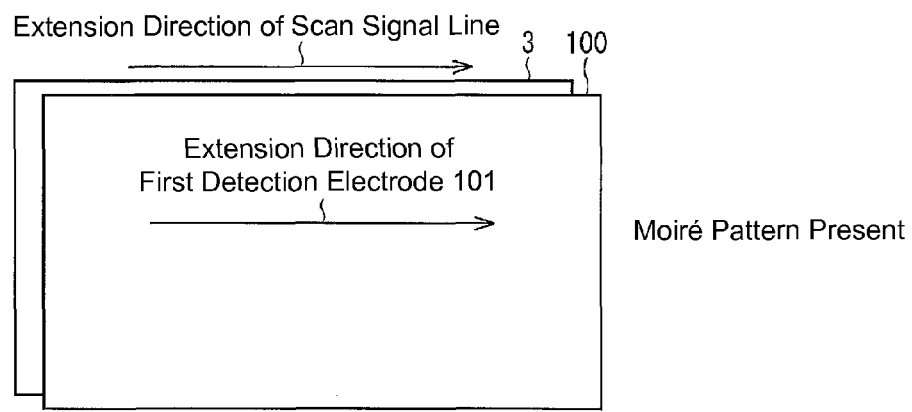
FIG. 20 shows a relation between the arrangement of the touch panel substrate and the occurrence of a moiré pattern.
Figure 20:
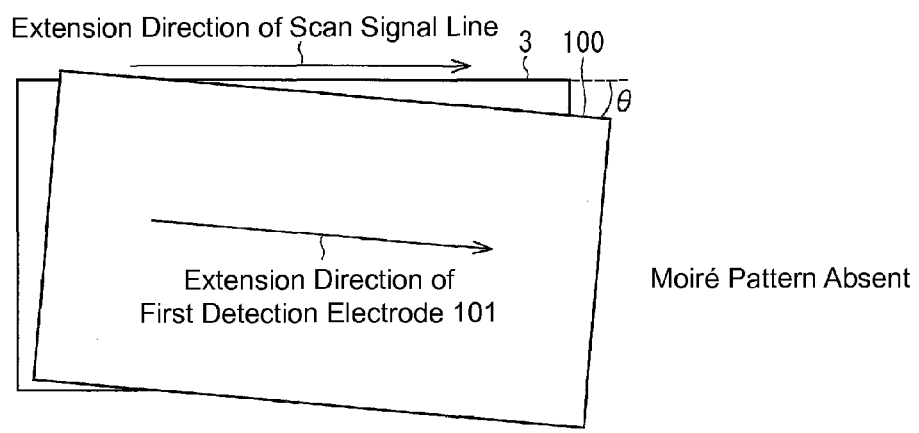

FIG. 20 shows a relation between the arrangement of the touch panel substrate and the occurrence of a moiré pattern. As shown in FIG. 20(a), if the display panel 3 and the touch panel substrate 100 are stacked together such that the direction in which the scan signal lines of the display panel 3 extend (horizontal direction) and the direction in which the first detection electrodes 101 of the touch panel substrate 100 extend match, a moiré pattern appears.

Even in such a case, if the display panel 3 and the touch panel substrate 100 are arranged at an incline with respect to each other as shown in FIG. 20(b), the moiré pattern sometimes disappears. FIG. 20(b) shows a case in which the display panel 3 and the touch panel substrate 100 are arranged such that the direction in which the first detection electrodes 101 of the touch panel substrate 100 is at an angle θ with respect to the direction in which the scan signal lines of the display panel 3 extend (horizontal direction). A plurality of different angles θ can exist in which the moiré pattern disappears. In the touch panel substrate 100, the direction in which the first detection electrodes 101 extend and the direction of the conductive lines in a grid pattern are at a 45° angle to each other. In other words, by rotating the touch panel substrate 100 with respect to the display panel 3, it is possible to similarly rotate the conductive lines of the touch panel substrate 100 with respect to the display panel 3. As a result, the moiré pattern disappears. At an angle close to this angle θ, the moiré pattern disappears or is diminished.

However, in reality, the display panel 3 and the touch panel substrate 100 cannot be bonded at an incline with respect to each other as shown in FIG. 20(b). If the touch panel substrate 100 is at an angle, then the direction of extension of the first detection electrodes 101 is also at an angle with respect to the display panel 3, and thus, it is not possible to perform appropriate position detection.

The touch panel substrate of the embodiment described below can be manufactured based on the angle θ above.

Embodiment

Figure 2:
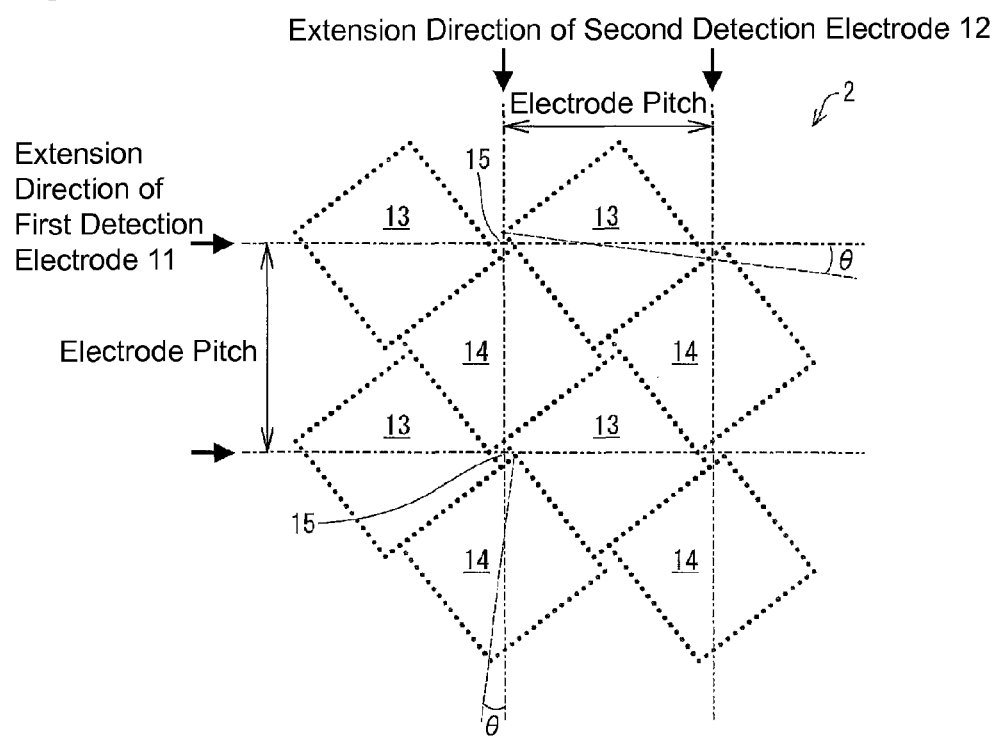
FIG. 2 is a plan view showing an arrangement of first detection electrodes and second detection electrodes in a touch panel substrate of one embodiment of the present invention.

FIG. 2 is a plan view showing an arrangement of the first detection electrodes 11 and the second detection electrodes 12 on the touch panel substrate 2 of the present embodiment. On the touch panel substrate 2, the plurality of first grid electrodes 13 and second grid electrodes 14, which have a square outer shape, are disposed. However, the squares indicating the outer shape respectively of the plurality of first grid electrodes 13 and the plurality of second grid electrodes 14 (area where they are formed) are all inclined at the same angle. The first grid electrodes 13 and the second grid electrodes 14 are formed in different layers from each other.

The first grid electrodes 13 and the second grid electrodes 14 are formed of conductive lines in a grid pattern to form squares. Thus, light emitted from the display panel can pass through the touch panel substrate 2.

The pitch of the first detection electrodes 11 is the same as the pitch of the second detection electrodes 12. Thus, it is possible to perform position detection at the same accuracy in both the vertical direction and the horizontal direction. The pitch of the first detection electrodes 11 and the pitch of the second detection electrodes 12 is determined as specifications based on the required performance (detection accuracy, detection resolution). Thus, the pitch of the first detection electrodes 11 and the pitch of the second detection electrodes 12 are the same as that of the comparison example shown in FIG. 18. However, the first grid electrodes 13 and the second grid electrodes 14 are at an incline compared to the comparison example, and the first grid electrodes 13 are disposed at a gap from each other. The second grid electrodes 14 are disposed at a gap from each other.

In FIG. 2, a detailed configuration of the first grid electrodes 13 and the second grid electrodes 14 is not shown, but the plurality of first grid electrodes 13 are disposed at a gap from each other in the horizontal direction, and the first grid electrodes 13 are connected to each other by the relay wiring lines formed in a square region 15 (first region) therebetween. Each first detection electrode 11 has a plurality of first grid electrodes 13 arranged horizontally. The plurality of first detection electrodes 11 extending in the horizontal direction are arranged in the vertical direction.

The plurality of second grid electrodes 14 aligned at a gap from each other in the vertical direction are electrically connected through another set of relay wiring lines formed in the square regions 15 therebetween. One second detection electrode 12 has a plurality of second grid electrodes 14 aligned vertically. The plurality of second detection electrodes 12 extending in the vertical direction are aligned horizontally.

A diagonal line in the first grid electrode 13 (diagonal line drawn between two opposite corners adjacent to the regions 15) is at an angle θ with respect to the direction in which the first detection electrodes 11 extend (horizontal direction). However, the first grid electrodes 13 are aligned in the direction in which the first detection electrodes 11 extend. Similarly, a diagonal line in the second grid electrode 14 (diagonal line drawn between two opposite corners adjacent to the regions 15) is at an angle θ with respect to the direction in which the second detection electrodes 12 extend (vertical direction). However, the second grid electrodes 14 are aligned in the direction in which the second detection electrodes 12 extend.

Figure 3:
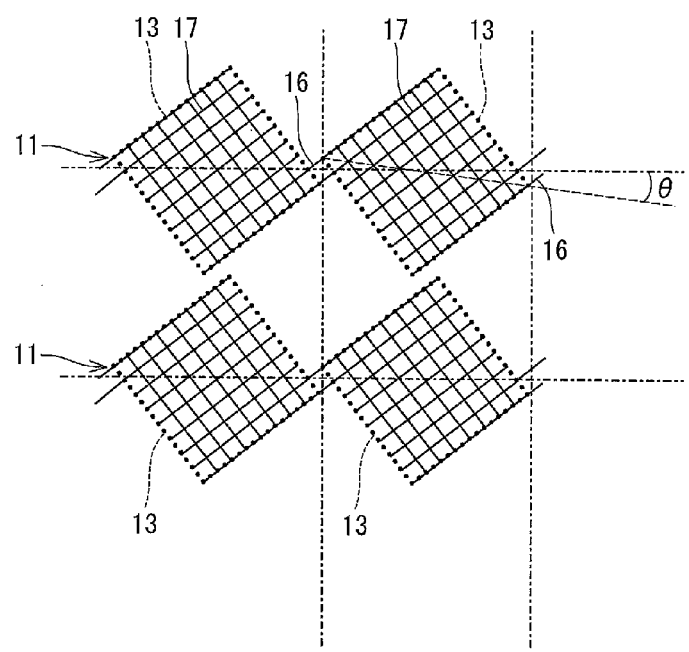
FIG. 3 is a plan view showing a detailed configuration of the first detection electrodes.

FIG. 3 is a plan view showing a detailed configuration of the first detection electrodes 11. In FIG. 3, the outer shape of the first grid electrodes 13 is depicted with dotted lines, and conductive lines 17 (first conductive lines) included in the first grid electrodes 13 are depicted with solid lines.

The first detection electrodes 11 extend in the horizontal direction and have a plurality of first grid electrodes 13. The first grid electrodes 13 adjacent to each other in the horizontal direction have gaps therebetween, and relay wiring lines 16 (first relay wiring lines) made of a conductive line are formed in these gaps. Adjacent first grid electrodes 13 are connected to each other through the relay wiring line 16. First grid electrodes 13 adjacent to each other in the vertical direction are separated. The first grid electrodes 13 and the relay wiring lines 16 are formed of the same layer (first electrode layer 6 in FIG. 1).

The conductive lines 17 in the first grid electrodes 13 are formed in a grid pattern parallel to the outer shape of the first grid electrodes 13. That is, the conductive lines 17 are formed in a grid pattern such that the respective conductive lines 17 are parallel to the sides of the outer shape (square) of the first grid electrodes 13. Here, the first grid electrodes 13 are square, and thus, the conductive lines 17 (grid wiring lines) constituting the first grid electrodes 13 are arranged in a square grid.

The conductive lines 17 and the relay wiring lines 16 are made of a low resistance metal or the like. Here, the relay wiring lines 16 are formed in a position where some of the grid pattern conductive lines 17 (grid wiring lines) extend.

The diagonal line in the first grid electrode 13 (diagonal line drawn between two opposite corners adjacent to the relay wiring lines 16) is at an angle θ with respect to the direction in which the first detection electrodes 11 extend (horizontal direction). In other words, a diagonal line drawn in a grid cell (smallest quadrilateral) of the grid forming the first grid electrode 13 is at the angle θ to the direction in which the first detection electrodes 11 extend (horizontal direction). However, the first grid electrodes 13 are aligned in the direction in which the first detection electrodes 11 extend.

In this manner, in the present embodiment, the first grid electrodes 13 and the grid pattern conductive lines 17 constituting this are formed at an incline of a prescribed angle, and first grid electrodes 13 adjacent to each other at a gap are connected through the relay wiring lines 16. As a result, it is possible to have a configuration in which the conductive lines 17 in a grid pattern constituting the first grid electrode 13 are inclined at an angle that mitigates the appearance of a moiré pattern, and in which the first detection electrodes 11 extend in the horizontal direction.

Figure 4:
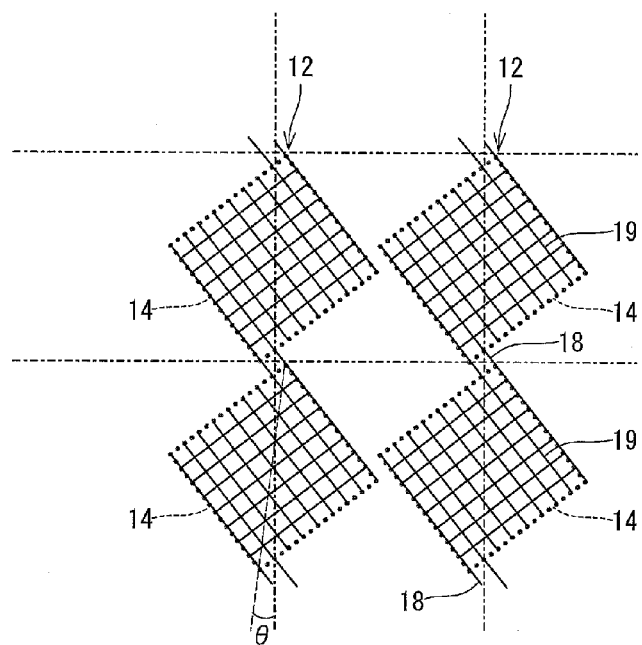
FIG. 4 is a plan view showing a detailed configuration of the second detection electrodes.

FIG. 4 is a plan view showing a detailed configuration of the second detection electrodes 12. In FIG. 4, the outer shape of the second grid electrodes 14 is depicted with dotted lines, and conductive lines 19 (second conductive lines) included in the second grid electrodes 14 are depicted with solid lines. The second detection electrodes 12 have the same configuration as the first detection electrodes 11 except rotated at 90°.

The second detection electrodes 12 extend in the vertical direction and have a plurality of second grid electrodes 14. The second grid electrodes 14 adjacent to each other in the vertical direction have gaps therebetween, and relay wiring lines 18 (second relay wiring lines) made of a conductive line are formed in these gaps. Adjacent second grid electrodes 14 are connected to each other through the relay wiring line 18. Second grid electrodes 14 adjacent to each other in the horizontal direction are separated. The second grid electrodes 14 and the relay wiring lines 18 are formed of the same layer (second electrode layer 7 in FIG. 1).

The conductive lines 19 in the second grid electrodes 14 are formed in a grid pattern parallel to the outer shape of the second grid electrodes 14. That is, the conductive lines 19 are formed in a grid pattern such that the respective conductive lines 19 are parallel to the sides of the outer shape (square) of the second grid electrodes 14. Here, the second grid electrodes 14 are square, and thus, the conductive lines 19 (grid wiring lines) constituting the second grid electrodes 14 are arranged in a square grid.

The conductive lines 19 and the relay wiring lines 18 are made of a low resistance metal or the like. Here, the relay wiring lines 18 are formed in a position where some of the grid pattern conductive lines 19 (grid wiring lines) extend.

The diagonal line in the second grid electrode 14 (diagonal line drawn between two opposite corners adjacent to the relay wiring lines 18) is at an angle θ with respect to the direction in which the second detection electrodes 12 extend (vertical direction). In other words, a diagonal line drawn in a grid cell (smallest quadrilateral) of the grid forming the second grid electrode 14 is at the same angle θ to the direction in which the second detection electrodes 12 extend (vertical direction). However, the second grid electrodes 14 are aligned in the direction in which the second detection electrodes 12 extend.

In this manner, in the present embodiment, the second grid electrodes 14 and the grid pattern conductive lines 19 constituting this are formed at an incline of a prescribed angle, and second grid electrodes 14 adjacent to each other at a gap are connected through the relay wiring lines 18. As a result, it is possible to have a configuration in which the conductive lines 19 in a grid pattern constituting the second grid electrode 14 are inclined at an angle that mitigates the appearance of a moiré pattern, and in which the second detection electrodes 12 extend in the vertical direction.

Figure 5:
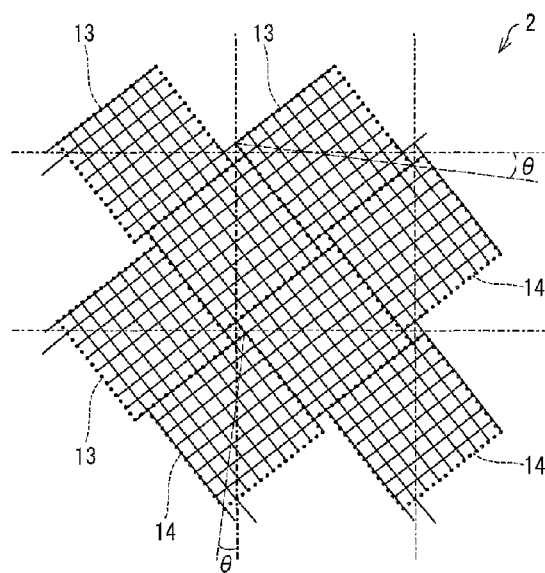
FIG. 5 is a view in which the first detection electrodes of FIG. 3 and the second detection electrodes of FIG. 4 are shown together, and is a plan view showing a configuration of wiring lines on the touch panel substrate.

FIG. 5 is a drawing in which the first detection electrodes 11 shown in FIG. 3 and the second detection electrodes 12 shown in FIG. 4 overlap, and FIG. 5 is a plan view showing the wiring structure of the touch panel substrate 2. When the first detection electrodes 11 and the second detection electrodes 12 are overlapped, an even grid pattern is formed over the entire touch panel substrate 2 (prescribed area where the detection electrodes are formed). The conductive lines 17 of the first detection electrodes 11 and the conductive lines 19 of the second detection electrodes are disposed so as not to overlap on the same line. Thus, the patterns of the first detection electrodes 11 and the second detection electrodes 12 are difficult to see by the user, which means display quality is not reduced. The direction in which the first detection electrodes 11 extend (horizontal direction) and the direction in which the second detection electrodes 12 extend (vertical direction) are perpendicular to each other.

A line of one direction of the grid formed by a black matrix (not shown) formed in the display panel 3 is parallel to the direction in which the first detection electrodes 11 extend (horizontal direction), and another line is parallel to the direction in which the second detection electrodes 12 extend (vertical direction).

A diagonal line drawn in a grid cell (smallest quadrilateral) of the grid forming the first grid electrode 13 or the second grid electrode 14 is at the angle to the direction in which the first detection electrodes 11 extend (horizontal direction) or the direction in which the second detection electrodes 12 extend (vertical direction). The conductive lines in a grid pattern are also at an angle with respect to both the direction in which the first detection electrodes 11 extend (horizontal direction) and the direction in which the second detection electrodes 12 extend (vertical direction). One of two diagonal lines in the grid is at an angle $\theta$)($0°<\theta<45°$ with respect to either the direction in which the first detection electrodes 11 extend (horizontal direction) or the direction in which the second detection electrodes 12 extend (vertical direction).

Conductive lines may be extended such that the conductive lines 17 of the first detection electrodes 11 and the conductive lines 19 of the second detection electrodes partially overlap, or some of the conductive lines may be removed in order to prevent conduction between first detection electrodes 11. The number of lines in a grid pattern or the like can be appropriately modified to split up the length of the sides of the outer shapes of the first grid electrodes 13 and the second grid electrodes 14.

Figure 6:
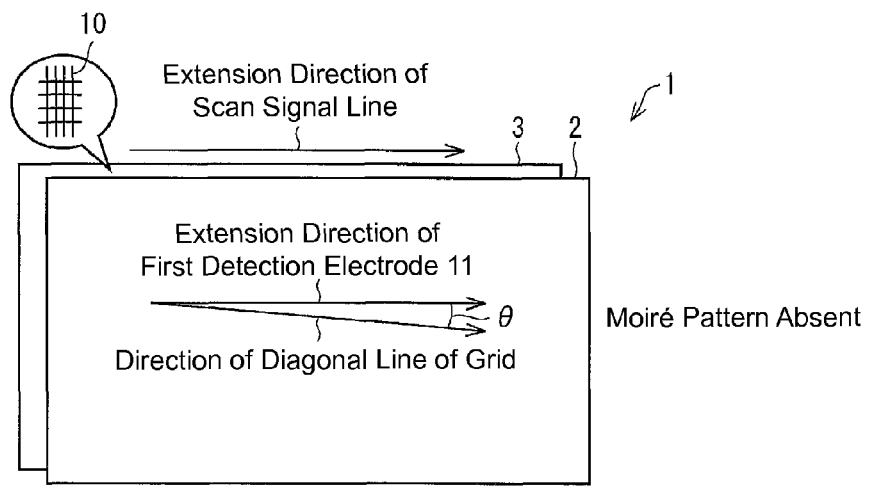
FIG. 6 shows a view of the touch panel substrate and a display panel stacked together.

FIG. 6 shows the touch panel substrate 2 and the display panel 3 stacked together. In the display panel 3, a black matrix 10 in a grid pattern delineating the pixels is formed. The black matrix 10 is made of a light shielding element. In the touch panel substrate 2, the first detection electrodes 11 extend in the horizontal direction and the second detection electrodes 12 extend in the vertical direction. On the other hand, in the touch panel substrate 2, one of the diagonal lines of the grid is at the angle $\theta$ to the direction in which the first detection electrodes 11 extend. Thus, even if the touch panel substrate 2 is not stacked onto the display panel 3 at an angle thereto, the display device 1 can mitigate the appearance of a moiré pattern and a contact position can be detected as appropriate.

The present embodiment differs from the conventional configuration in which the square grid electrodes are disposed with no gap therebetween, and the first grid electrodes 13 and the second grid electrodes 14 are formed at an incline together with the grids therein, and in the gaps (regions 15) between the first grid electrodes 13 and the second grid electrodes 14, the relay wiring lines 16 and 18 are formed. By changing the angle at which the first grid electrodes 13 and the second grid electrodes 14 are inclined and by changing the size of the regions 15 where the relay wiring lines 16 and 18 are formed, an even conductive line grid can be formed on the touch panel substrate 2. In addition, the grid of the conductive lines can be inclined at a desired angle $\theta$. Thus, it is possible to mitigate the occurrence of a moiré pattern and it is possible to manufacture the display device 1 by which display quality is improved.

Embodiment 2

Embodiment 1 described a case in which the pitch of the first detection electrodes and the pitch of the second detection electrodes is the same. In the present embodiment, a case will be described in which the pitch of the first detection electrode and the pitch of the second detection electrode are different. For ease of explanation, the members and components having the same functions as those in the drawings described in Embodiment 1 above are assigned the same reference characters, and the descriptions thereof are omitted.

Generally, the pitch of the detection electrodes is calculated by dividing the width and height of a prescribed region (position detection region) of the touch panel where position detection is performed respectively by the number of detection electrodes. However, depending on the vertical/horizontal ratio in the position detection region of the touch panel, there are cases in which the pitch of the first detection electrodes cannot be made the same as the pitch of the second detection electrodes. However, even in this case, the pitches in the vertical and horizontal directions differ only slightly.

Figure 7:
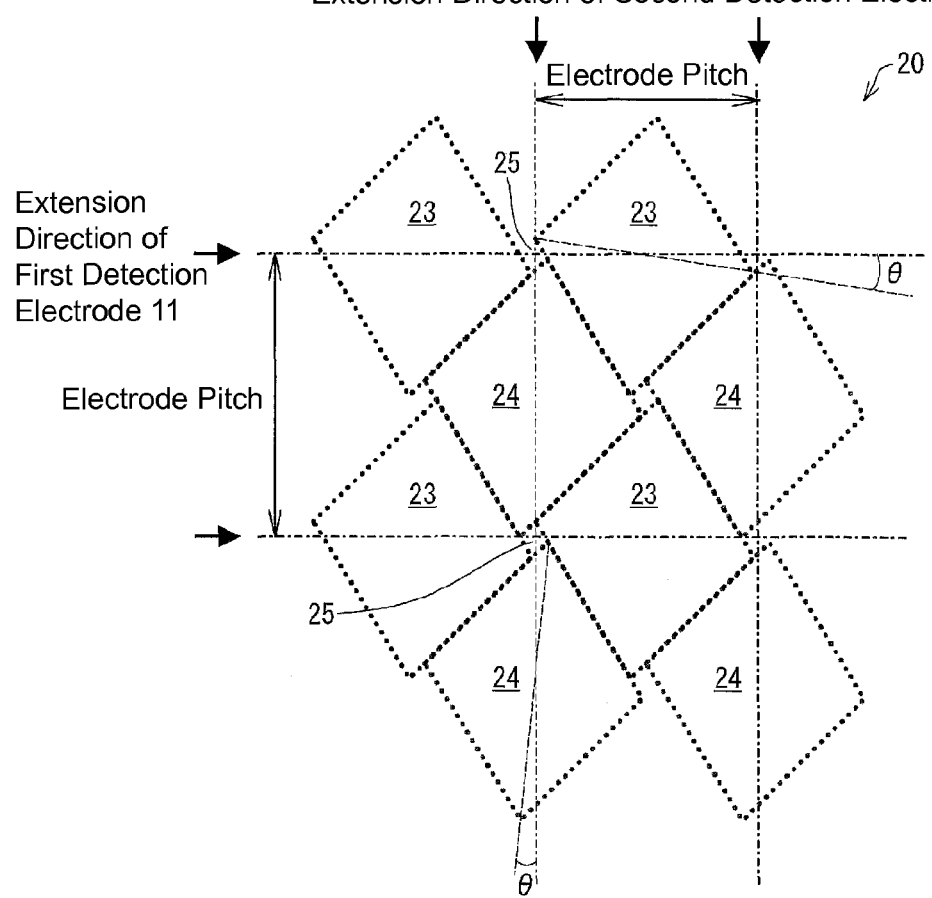
FIG. 7 is a plan view showing an arrangement of first detection electrodes and second detection electrodes in a touch panel substrate of another embodiment of the present invention.

FIG. 7 is a plan view showing an arrangement of first detection electrodes 11 and second detection electrodes 12 in a touch panel substrate 20 of the present embodiment. The layered structure of the touch panel substrate 20 is the same as that shown in FIG. 1. In the touch panel substrate 20, the pitch of the first detection electrode 11 and the pitch of the second detection electrodes 12 differ from each other, and the pitch of the first detection electrodes 11 is larger than the pitch of the second detection electrodes 12. Thus, a plurality of first grid electrodes 23 and second grid electrodes 24 arranged in the touch panel substrate 20 have diamond shapes that are vertically long. Also, the diamonds indicating the outer shapes respectively of the plurality of first grid electrodes 23 and the plurality of second grid electrodes 24 (regions where they are formed) are all inclined at the same angle. The first grid electrodes 23 and the second grid electrodes 24 are formed in the same layer as each other.

The plurality of first grid electrodes 23 aligned at a gap from each other in the horizontal direction are electrically connected through relay wiring lines formed in the diamond regions 25 therebetween. One first detection electrode 11 has a plurality of first grid electrodes 23 aligned vertically. The plurality of first detection electrodes 11 extending in the horizontal direction are aligned vertically.

The plurality of second grid electrodes 24 aligned at a gap from each other in the vertical direction are electrically connected through another set of relay wiring lines formed in the diamond regions 25 therebetween. One second detection electrode 12 has a plurality of second grid electrodes 24 aligned vertically. The plurality of second detection electrodes 12 extending in the vertical direction are aligned horizontally.

A diagonal line in the first grid electrode 23 (diagonal line drawn between two opposite corners adjacent to the regions 25) is at an angle $\theta$ with respect to the direction in which the first detection electrodes 11 extend (horizontal direction). However, the first grid electrodes 23 are aligned in the direction in which the first detection electrodes 11 extend. Similarly, a diagonal line in the second grid electrode 24 (diagonal line drawn between two opposite corners adjacent to the regions 25) is at an angle $\theta$ with respect to the direction in which the second detection electrodes 12 extend (vertical direction). However, the second grid electrodes 24 are aligned in the direction in which the second detection electrodes 12 extend.

Figure 8:
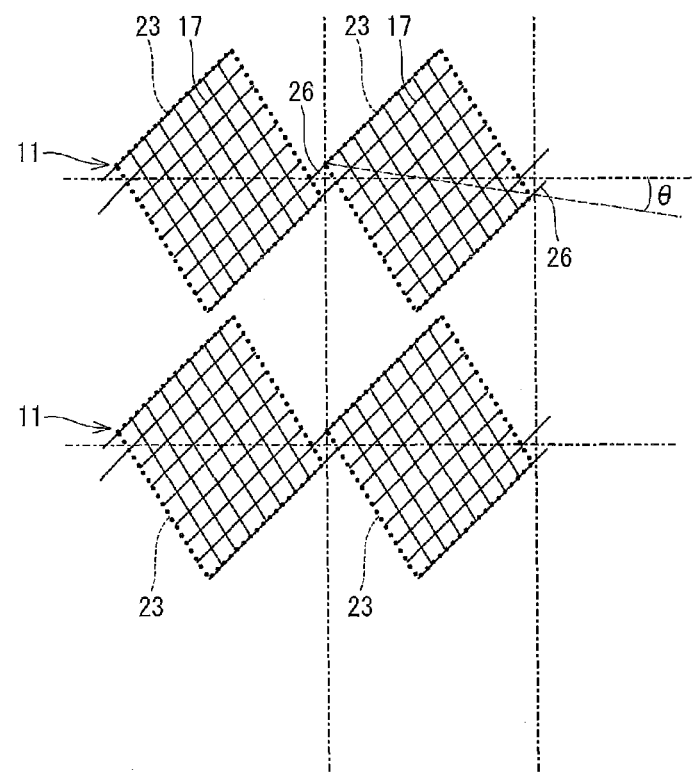
FIG. 8 is a plan view showing a detailed configuration of the first detection electrodes.

FIG. 8 is a plan view showing a detailed configuration of the first detection electrodes 11. In FIG. 8, the outer shape of the first grid electrodes 23 is depicted with dotted lines, and conductive lines 17 included in the first grid electrodes 23 are depicted with solid lines.

The first grid electrodes 23 adjacent to each other in the horizontal direction have gaps therebetween, and relay wiring lines 26 (first relay wiring lines) made of a conductive line are formed in these gaps. Adjacent first grid electrodes 23 are connected to each other through the relay wiring line 26. First grid electrodes 23 adjacent to each other in the vertical direction are separated.

The conductive lines 17 in the first grid electrodes 23 are formed in a grid pattern parallel to the outer shape of the first grid electrodes 23. That is, the conductive lines 17 are formed in a grid pattern such that the respective conductive lines 17 are parallel to the sides of the outer shape (diamond) of the first grid electrodes 23. Here, the first grid electrodes 23 are diamond-shaped, and thus, the conductive lines 17 (grid wiring lines) constituting the first grid electrodes 23 are arranged in a diamond grid.

The relay wiring lines 26 are formed in a position where some of the grid pattern conductive lines 17 (grid wiring lines) extend.

The diagonal line in the first grid electrode 23 (diagonal line drawn between two opposite corners adjacent to the relay wiring lines 26) is at an angle θ with respect to the direction in which the first detection electrodes 11 extend (horizontal direction). In other words, a diagonal line drawn in a grid cell (smallest quadrilateral) of the grid forming the first grid electrode 23 is at the same angle θ to the direction in which the first detection electrodes 11 extend (horizontal direction).

Figure 9:
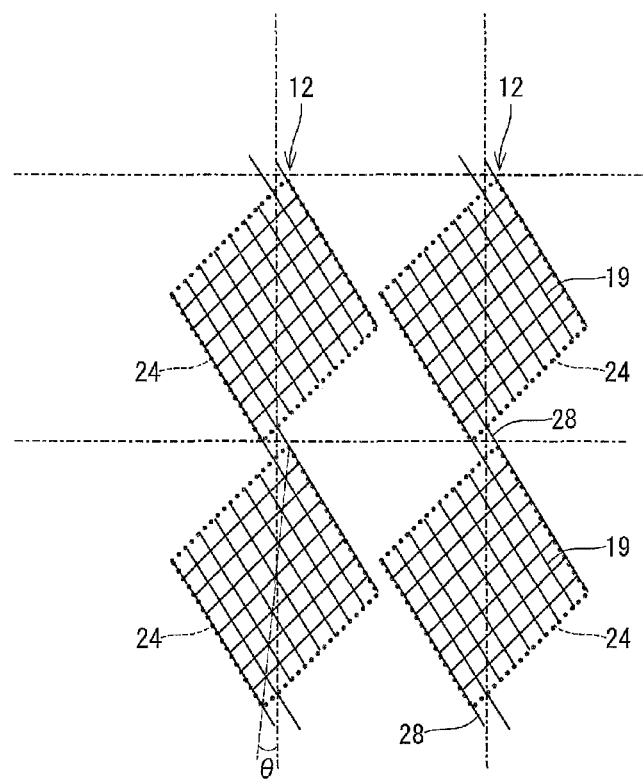
FIG. 9 is a plan view showing a detailed configuration of the second detection electrodes.

FIG. 9 is a plan view showing a detailed configuration of the second detection electrodes 12. In FIG. 9, the outer shape of the second grid electrodes 24 is depicted with dotted lines, and conductive lines 19 included in the second grid electrodes 24 are depicted with solid lines.

The second grid electrodes 24 adjacent to each other in the vertical direction have gaps therebetween, and relay wiring lines 28 (second relay wiring lines) made of a conductive line are formed in these gaps. Adjacent second grid electrodes 24 are connected to each other through the relay wiring line 28. Second grid electrodes 24 adjacent to each other in the horizontal direction are separated.

The conductive lines 19 in the second grid electrodes 24 are formed in a grid pattern parallel to the outer shape of the second grid electrodes 24. That is, the conductive lines 19 are formed in a grid pattern such that the respective conductive lines 19 are parallel to the sides of the outer shape (diamond) of the second grid electrodes 24. Here, the second grid electrodes 24 are diamond-shaped, and thus, the conductive lines 19 (grid wiring lines) constituting the second grid electrodes 24 are arranged in a diamond grid.

The relay wiring lines 28 are formed in a position where some of the grid pattern conductive lines 19 (grid wiring lines) extend.

The diagonal line in the second grid electrode 24 (diagonal line drawn between two opposite corners adjacent to the relay wiring lines 28) is at an angle θ with respect to the direction in which the second detection electrodes 12 extend (vertical direction). In other words, a diagonal line drawn in a grid cell (smallest quadrilateral) of the grid forming the second grid electrode 24 is at the angle θ to the direction in which the second detection electrodes 12 extend (vertical direction).

Figure 10:
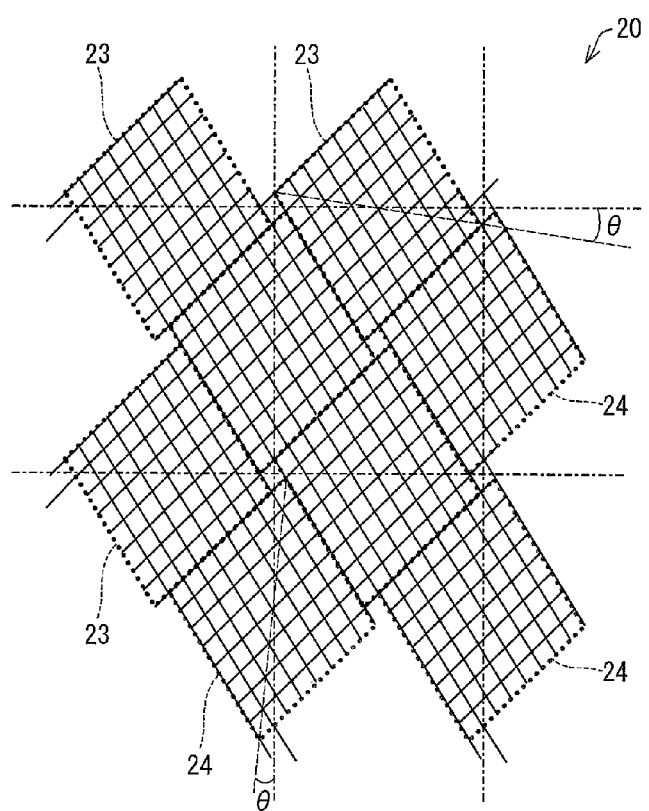
FIG. 10 is a view in which the first detection electrodes of FIG. 8 and the second detection electrodes of FIG. 9 are shown together, and is a plan view showing a configuration of wiring lines on the touch panel substrate.

FIG. 10 shows together the first detection electrodes 11 of FIG. 8 and the second detection electrodes 12 of FIG. 9, and FIG. 10 is a plan view showing the wiring structure of the touch panel substrate 20. When the first detection electrodes 11 and the second detection electrodes 12 are overlapped, an even diamond grid pattern is formed over the entire touch panel substrate 20 (prescribed area where the detection electrodes are formed). The conductive lines 17 of the first detection electrodes 11 and the conductive lines 19 of the second detection electrodes 12 are disposed so as not to overlap on the same line. Thus, the patterns of the first detection electrodes 11 and the second detection electrodes 12 are difficult to see by the user, which means display quality is not reduced. The direction in which the first detection electrodes 11 extend (horizontal direction) and the direction in which the second detection electrodes 12 extend (vertical direction) are perpendicular to each other.

A diagonal line drawn in a grid cell (smallest quadrilateral) of the grid forming the first grid electrode 23 or the second grid electrode 24 is at the angle to the direction in which the first detection electrodes 11 extend (horizontal direction) or the direction in which the second detection electrodes 12 extend (vertical direction). The conductive lines in a grid pattern are also at an angle with respect to both the direction in which the first detection electrodes 11 extend (horizontal direction) and the direction in which the second detection electrodes 12 extend (vertical direction). One of two diagonal lines in the grid is at an angle $\theta(0°<\theta<45°)$ with respect to either the direction in which the first detection electrodes 11 extend (horizontal direction) or the direction in which the second detection electrodes 12 extend (vertical direction).

In the present embodiment, the first grid electrodes 23 and the second grid electrodes 24 having diamond outer shapes are formed at an incline together with the grids therein, and in the gaps (regions 25) between the first grid electrodes 23 and the second grid electrodes 24, the relay wiring lines 26 and 28 are formed. Thus, even if the pitch of the first detection electrodes 11 differs from the pitch of the second detection electrodes 12, an even conductive line grid can be formed in the touch panel substrate 20. In addition, the grid of the conductive lines can be inclined at a desired angle θ. Thus, it is possible to mitigate the appearance of a moiré pattern and improve display quality.

If the horizontal and vertical pitches differ slightly, the grid-shaped electrodes are substantially square or substantially diamond. Similarly, the respective grid cells of the conductive lines constituting the grid-shaped electrodes are substantially square or substantially diamond. As described in the present embodiment, the respective grid-shaped electrodes are disposed at an incline with relay wiring lines formed in the gaps therebetween, and thus, the first detection electrodes can extend in the horizontal direction and the second detection electrodes can extend in the vertical direction. Thus, an even grid can be formed while mitigating the appearance of the moiré pattern, and it is possible to detect contact position appropriately.

Embodiment 3

In the present embodiment, a case in which the angle θ is greater than that of Embodiment 1 will be described. For ease of explanation, the members and components having the same functions as those in the drawings described in Embodiment 1 above are assigned the same reference characters, and the descriptions thereof are omitted.

Figure 11:
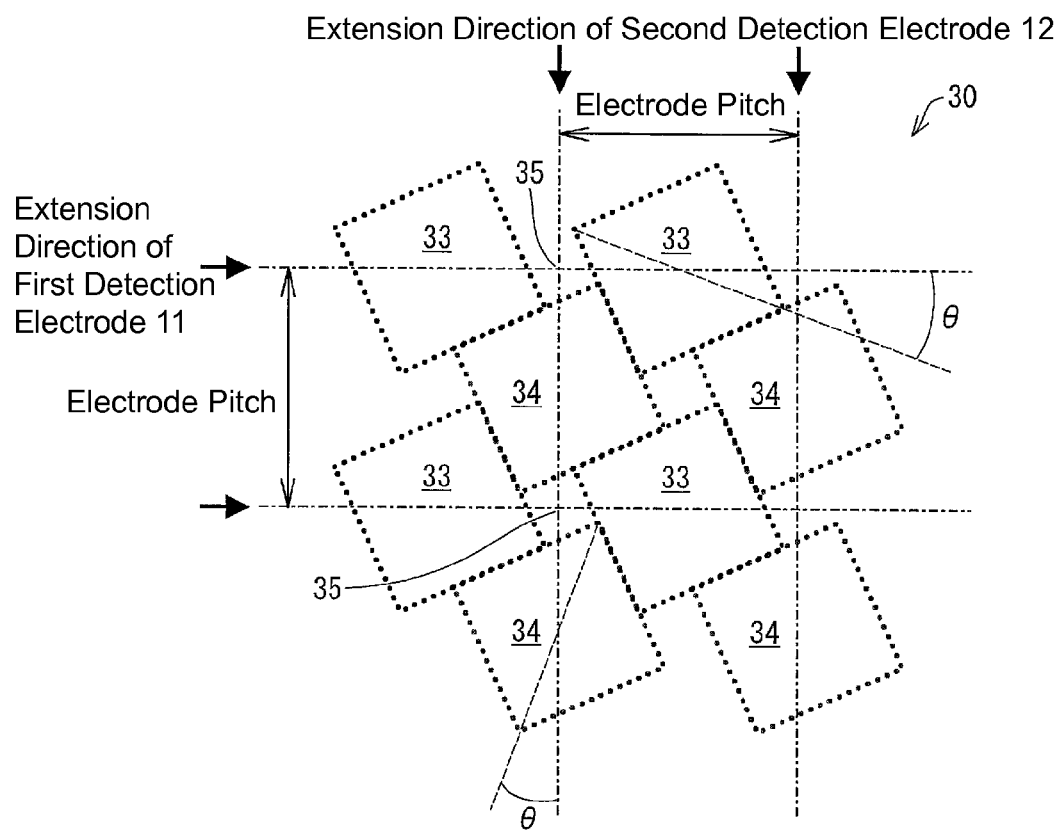
FIG. 11 is a plan view showing an arrangement of first detection electrodes and second detection electrodes in a touch panel substrate of yet another embodiment of the present invention.

FIG. 11 is a plan view showing an arrangement of first detection electrodes 11 and second detection electrodes 12 in a touch panel substrate 30 of the present embodiment. The layered structure of the touch panel substrate 30 is the same as that shown in FIG. 1. The touch panel substrate 30 is provided with a plurality of first grid electrodes 33 and second grid electrodes 34 having square outer shapes. However, the squares indicating the outer shapes respectively of the plurality of first grid electrodes 33 and the plurality of second grid electrodes 34 (regions where they are formed) are all inclined at the same angle. The first grid electrodes 33 and the second grid electrodes 34 are formed in the same layer as each other.

The plurality of first grid electrodes 23 aligned at a gap from each other in the horizontal direction are electrically connected through relay wiring lines formed in the square regions 35 therebetween. One first detection electrode 11 has a plurality of first grid electrodes 33 aligned vertically. The plurality of first detection electrodes 11 extending in the horizontal direction are aligned vertically.

The plurality of second grid electrodes 34 aligned at a gap from each other in the vertical direction are electrically connected through another set of relay wiring lines formed in the square regions 35 therebetween. One second detection electrode 12 has a plurality of second grid electrodes 34 aligned vertically. The plurality of second detection electrodes 12 extending in the vertical direction are aligned horizontally.

The pitch of the first detection electrodes 11 is the same as the pitch of the second detection electrodes 12. Also, the pitch of the first detection electrodes 11 and the pitch of the second detection electrodes 12 are the same as those of Embodiment 1.

A diagonal line in the first grid electrode 23 (diagonal line drawn between two opposite corners adjacent to the regions 35) is at an angle θ with respect to the direction in which the first detection electrodes 11 extend (horizontal direction). However, the first grid electrodes 33 are aligned in the direction in which the first detection electrodes 11 extend. Similarly, a diagonal line in the second grid electrode 34 (diagonal line drawn between two opposite corners adjacent to the regions 35) is at an angle θ with respect to the direction in which the second detection electrodes 12 extend (vertical direction). However, the second grid electrodes 34 are aligned in the direction in which the second detection electrodes 12 extend.

However, the first grid electrodes 33 and the second grid electrodes 34 are inclined at a greater angle than the first grid electrodes and the second grid electrodes of Embodiment 1, and the first grid electrodes 33 are disposed at a gap from each other. The second grid electrodes 34 are disposed at a gap from each other. Thus, compared to Embodiment 1, the gap (region 35) between the first grid electrodes 33 and between the second grid electrodes 34 is large.

Figure 12:
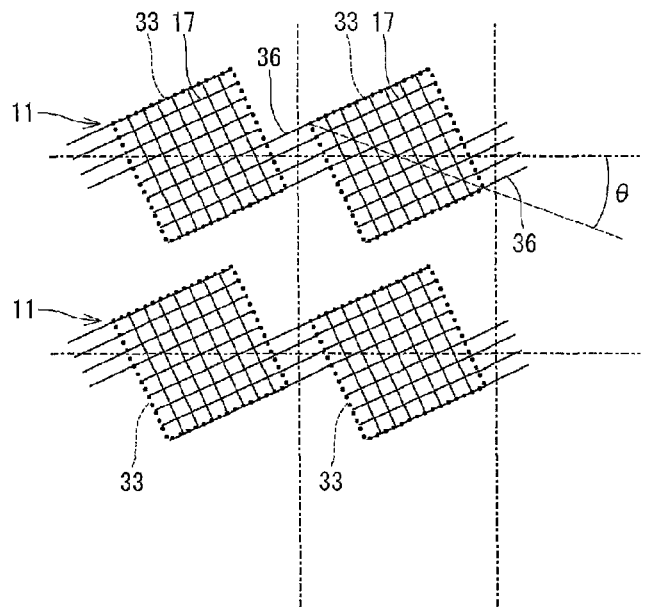
FIG. 12 is a plan view showing a detailed configuration of the first detection electrodes.

FIG. 12 is a plan view showing a detailed configuration of the first detection electrodes 11. In FIG. 12, the outer shapes of the first grid electrodes 33 are depicted with dotted lines and the conductive lines 17 constituting the first grid electrodes 33 are depicted with solid lines.

The first grid electrodes 33 adjacent to each other in the horizontal direction have gaps therebetween, and relay wiring lines 36 (first relay wiring lines) made of a conductive line are formed in these gaps. Adjacent first grid electrodes 33 are connected to each other through the relay wiring line 36. First grid electrodes 33 adjacent to each other in the vertical direction are separated.

The conductive lines 17 in the first grid electrodes 33 are formed in a grid pattern parallel to the outer shape of the first grid electrodes 33. That is, the conductive lines 17 are formed in a grid pattern such that the respective conductive lines 17 are parallel to the sides of the outer shape (square) of the first grid electrodes 33. Here, the first grid electrodes 33 are square, and thus, the conductive lines 17 (grid wiring lines) constituting the first grid electrodes 33 are arranged in a square grid.

The relay wiring lines 36 are formed in a position where some of the grid pattern conductive lines 17 (grid wiring lines) extend. The regions where the relay wiring lines 36 are formed are larger than those of Embodiment 1, and thus, more relay wiring lines 36 are formed than in Embodiment 1.

The diagonal line in the first grid electrode 33 (diagonal line drawn between two opposite corners adjacent to the relay wiring lines 36) is at an angle θ with respect to the direction in which the first detection electrodes 11 extend (horizontal direction). In other words, a diagonal line drawn in a grid cell (smallest quadrilateral) of the grid forming the first grid electrode 33 is at the same angle θ to the direction in which the first detection electrodes 11 extend (horizontal direction).

Figure 13:
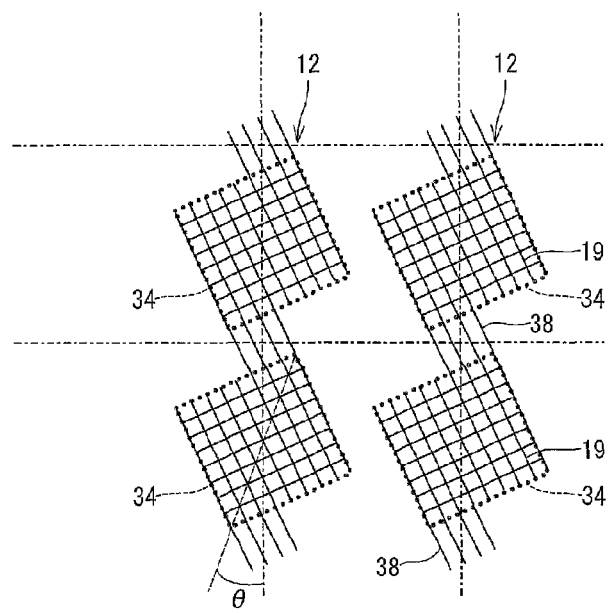
FIG. 13 is a plan view showing a detailed configuration of the second detection electrodes.

FIG. 13 is a plan view showing a detailed configuration of the second detection electrodes 12. In FIG. 13, the outer shapes of the second grid electrodes 34 are depicted with dotted lines and the conductive lines 19 constituting the second grid electrodes 34 are depicted with solid lines.

The second grid electrodes 34 adjacent to each other in the vertical direction have gaps therebetween, and relay wiring lines 38 (second relay wiring lines) made of a conductive line are formed in these gaps. Adjacent second grid electrodes 34 are connected to each other through the relay wiring line 38. Second grid electrodes 34 adjacent to each other in the horizontal direction are separated.

The conductive lines 19 in the second grid electrodes 34 are formed in a grid pattern parallel to the outer shape of the second grid electrodes 34. That is, the conductive lines 19 are formed in a grid pattern such that the respective conductive lines 19 are parallel to the sides of the outer shape (square) of the second grid electrodes 34. Here, the second grid electrodes 34 are square, and thus, the conductive lines 19 (grid wiring lines) constituting the second grid electrodes 34 are arranged in a square grid.

The relay wiring lines 38 are formed in a position where some of the grid pattern conductive lines 19 (grid wiring lines) extend.

Figure 14:
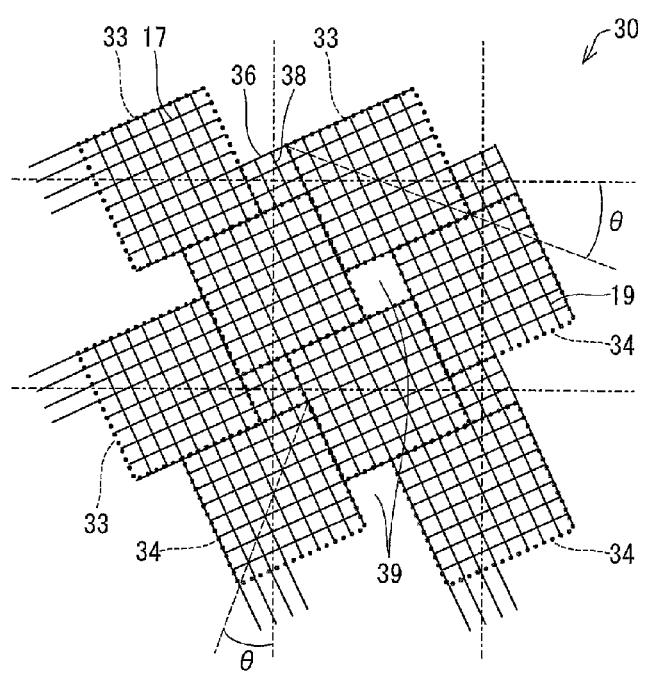
FIG. 14 is a view in which the first detection electrodes of FIG. 12 and the second detection electrodes of FIG. 13 are shown together, and is a plan view showing a configuration of wiring lines on the touch panel substrate.

FIG. 14 is a view showing the first detection electrodes 11 of FIG. 12 and the second detection electrodes 12 of FIG. 13 together, and FIG. 14 is a plan view showing the wiring structure of the touch panel substrate 30. When the first detection electrodes 11 and the second detection electrodes 12 are overlapped, a substantially even square grid pattern is formed over the entire touch panel substrate 30 (prescribed area where the detection electrodes are formed). The conductive lines 17 of the first detection electrodes 11 and the conductive lines 19 of the second detection electrodes 12 are disposed so as not to overlap on the same line. Of the gaps between the first grid electrodes 33 and the second grid electrodes 34, a region 39 where the relay wiring lines 36 and 38 are not formed is an empty region where conductive lines are not formed. However, the empty regions are evenly distributed, and thus, difficult to see by the user. The direction in which the first detection electrodes 11 extend (horizontal direction) and the direction in which the second detection electrodes 12 extend (vertical direction) are perpendicular to each other.

A diagonal line drawn in a grid cell (smallest quadrilateral) of the grid forming the first grid electrode 33 or the second grid electrode 34 is at the angle to the direction in which the first detection electrodes 11 extend (horizontal direction) or the direction in which the second detection electrodes 12 extend (vertical direction). The conductive lines in a grid pattern are also at an angle with respect to both the direction in which the first detection electrodes 11 extend (horizontal direction) and the direction in which the second detection electrodes 12 extend (vertical direction). One of two diagonal lines in the grid is at an angle θ (0°<θ<45°) with respect to either the direction in which the first detection electrodes 11 extend (horizontal direction) or the direction in which the second detection electrodes 12 extend (vertical direction).

In the present embodiment, by making the region 35 where the relay wiring lines 36 and 38 are formed large, it is possible to increase the angle θ at which the first grid electrodes 33 and the second grid electrodes 34 are inclined while maintaining the same pitch for the first detection electrodes 11 and the second detection electrodes 12. In addition, the sizes of the individual first grid electrodes 33 and second grid electrodes 34 also become slightly smaller. If the number of conductive lines 17 formed in the first grid electrodes 33 remains the same, then the pitch of the conductive lines constituting the grid also becomes small. However, the change in pitch in conductive lines in relation to the change in angle θ is small. Thus, because there is a range in angles at which the moiré pattern disappears, as long as the angle θ of the grids of the touch panel substrate 30 is at a desired angle (within an angle in which the moiré pattern disappears in the touch panel substrate of the comparison example), a moiré pattern either does not appear, or is weakened. The touch panel substrate 30 of the present embodiment can mitigate the appearance of the moiré pattern and improve display quality.

Embodiment 4

In the present embodiment, a configuration in which a grid pattern is also formed in the empty region 39 of Embodiment 3 will be described. For ease of explanation, the members and components having the same functions as those in the drawings described in Embodiment 3 above are assigned the same reference characters, and the descriptions thereof are omitted.

The arrangement and angle θ of the first grid electrodes and the second grid electrodes are the same as the configuration of FIG. 11.

Figure 15:
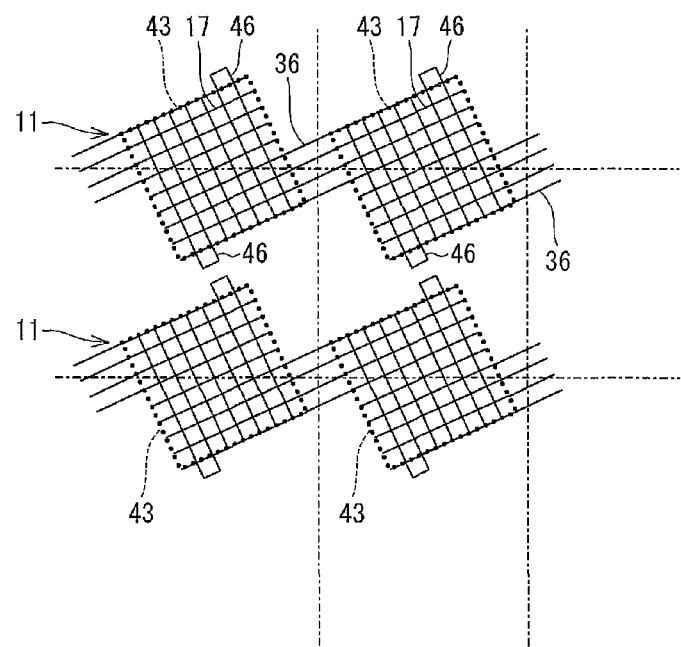
FIG. 15 is a plan view showing a detailed configuration of the first detection electrodes in yet another embodiment of the present invention.

FIG. 15 is a plan view showing a detailed configuration of first detection electrodes 11 of the present embodiment. In FIG. 15, the outer shapes of the first grid electrodes 43 are depicted with dotted lines and the conductive lines 17 constituting the first grid electrodes 43 are depicted with solid lines.

The first grid electrodes 43 of the present embodiment differ from the first grid electrodes 33 of FIG. 12 in that extension grid wiring lines 46 for filling the empty space are provided. The extension grid wiring lines 46 are formed so as to extend some of the wiring lines in a grid into a region (second region) corresponding to the region 39 of FIG. 14, which is the empty region. The extension grid wiring lines 46 provided in two first grid electrodes 43 adjacent in the vertical direction face each other but do not contact each other. Thus, there is no conduction between the first detection electrodes 11 adjacent to each other in the vertical direction.

Figure 16:
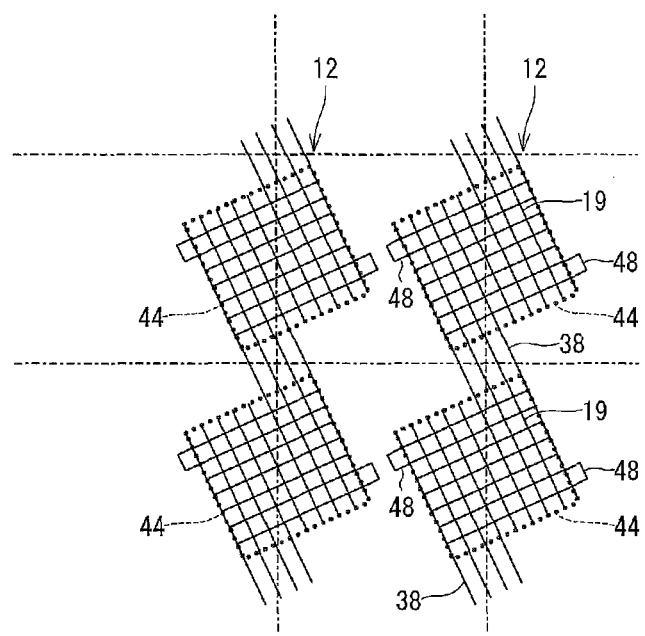
FIG. 16 is a plan view showing a detailed configuration of the second detection electrodes in yet another embodiment of the present invention.

FIG. 16 is a plan view showing a detailed configuration of second detection electrodes 12 of the present embodiment. In FIG. 16, the outer shapes of the second grid electrodes 44 are depicted with dotted lines and the conductive lines 19 constituting the second grid electrodes 44 are depicted with solid lines.

The second grid electrodes 44 of the present embodiment are provided with extension grid wiring lines 48 for filling the empty region. The extension grid wiring lines 48 are formed so as to extend some of the wiring lines in a grid into a position corresponding to the region 39 of FIG. 14, which is the empty region. The extension grid wiring lines 48 provided in two second grid electrodes 44 adjacent in the horizontal direction face each other but do not contact each other. Thus, there is no conduction between the second detection electrodes 12 adjacent to each other in the horizontal direction.

Figure 17:
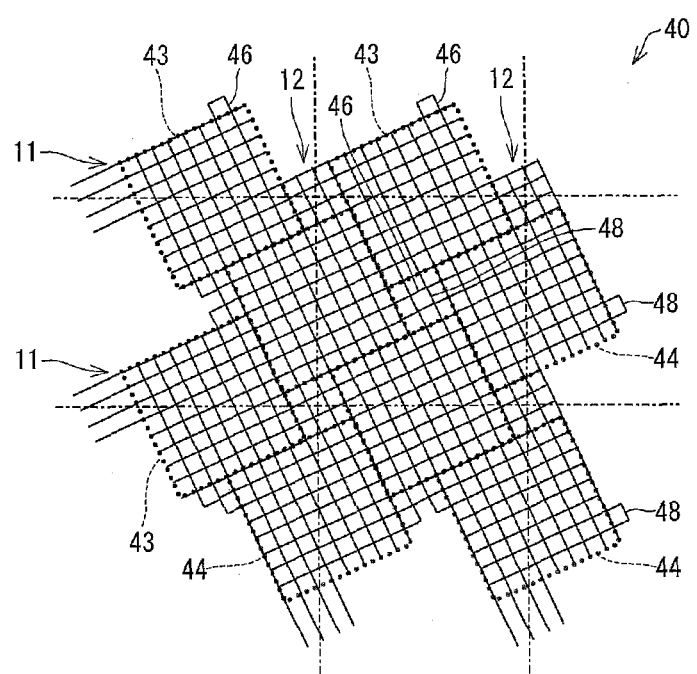
FIG. 17 is a view in which the first detection electrodes of FIG. 15 and the second detection electrodes of FIG. 16 are shown together, and is a plan view showing a configuration of wiring lines on the touch panel substrate.

FIG. 17 is a view showing the first detection electrodes 11 of FIG. 15 and the second detection electrodes 12 of FIG. 16 together, and FIG. 17 is a plan view showing the wiring structure of the touch panel substrate 40. When the first detection electrodes 11 and the second detection electrodes 12 are overlapped, an even square grid pattern is formed over the entire touch panel substrate 40 (prescribed area where the detection electrodes are formed). The conductive lines 17 of the first detection electrodes 11 and the conductive lines 19 of the second detection electrodes 12 are disposed so as not to overlap on the same line.

In the present embodiment, in regions where the relay wiring lines are not formed, the extension grid wiring lines 46 and 48 are formed, and thus, an even grid pattern can be formed over the entire touch panel substrate 40. Thus, the patterns of the first detection electrodes 11 and the second detection electrodes 12 are difficult to see by the user, which means display quality is not reduced. Also, the diagonal lines of the grids can be inclined at an appropriate angle θ, and thus, it is possible to mitigate the appearance of the moiré pattern and to improve display quality in the touch panel substrate 40.

SUMMARY

A touch panel substrate according to a first aspect of the present invention includes a first detection electrode having a plurality of first grid electrodes each having a quadrilateral outer shape, the first grid electrodes being arranged in a first direction. The touch panel further includes a second detection electrode having a plurality of second grid electrodes each having a quadrilateral outer shape, the second grid electrodes being arranged in a second direction differing from the first direction. Each of the first grid electrodes includes first conductive lines formed in a grid pattern such that sides of cells of the grid pattern are respectively parallel to sides of the quadrilateral outer shape of the first grid electrode. The first grid electrodes adjacent to each other in the first direction are electrically connected by a first relay wiring line formed therebetween. Each of the first grid electrodes has two opposing corners forming a diagonal line generally extending in the first direction but inclined with respect to the first direction. Each of the second grid electrodes includes second conductive lines formed in a grid pattern such that sides of cells of the grid pattern are respectively parallel to sides of the quadrilateral outer shape of the second grid electrode. The second grid electrodes adjacent to each other in the second direction are electrically connected by a second relay wiring line formed therebetween, and wherein each of the second grid electrodes has two opposing corners forming a diagonal line generally extending in the second direction but inclined with respect to the second direction.

According to this configuration, the first grid electrodes and the second grid electrodes are respectively inclined with respect to the first direction and the second direction along with the grids therein. Additionally, the first detection electrodes and the second detection electrodes respectively extend in the first direction and the second direction. Thus, it is possible to improve display quality by mitigating the occurrence of the moiré pattern, and contact position can be appropriately detected.

A touch panel substrate according to a second aspect of the present invention is the touch panel substrate of the first aspect, which can be configured such that the first direction is perpendicular to the second direction.

A touch panel substrate according to a third aspect of the present invention is the touch panel substrate of the first or second aspect, which can be configured such that the quadrilateral outer shapes of the first grid electrodes and the second grid electrodes are diamond-shaped.

A touch panel substrate according to a fourth aspect of the present invention is the touch panel substrate of the first to third aspects, which can be configured such that the quadrilateral outer shapes of the first grid electrodes and the second grid electrodes are square.

A touch panel substrate according to a fifth aspect of the present invention is the touch panel substrate of the second aspect, which can be configured such that the touch panel substrate includes: a plurality of the first detection electrodes arranged in the second direction; and a plurality of the second detection electrodes arranged in the first direction, a pitch of the plurality of first detection electrodes being the same as a pitch of the plurality of second detection electrodes, and the quadrilateral outer shapes of the first grid electrodes and the second grid electrodes being square.

A touch panel substrate according to a sixth aspect of the present invention is the touch panel substrate of the fourth or fifth aspect, which can be configured such that the first conductive lines are formed in a square grid pattern such that sides of cells of the grid pattern are respectively parallel to sides of the quadrilateral outer shape of each of the first grid electrodes, and the second conductive lines are formed in a square grid pattern such that sides of cells of the grid pattern are respectively parallel to sides of the quadrilateral outer shape of each of the second grid electrodes.

A touch panel substrate according to a seventh aspect of the present invention is the touch panel substrate of the first to sixth aspects, which can be configured such that one diagonal line of each of the first grid electrodes is inclined at an angle θ with respect to the first direction, and another diagonal line of the each of the first grid electrodes is inclined at the angle θ with respect to the second direction.

A touch panel substrate according to an eighth aspect of the present invention is the touch panel substrate of the first to seventh aspects, which can be configured such that the first detection electrode is formed in a first layer and the second detection electrode is formed in a second layer differing from the first layer.

A touch panel substrate according to a ninth aspect of the present invention is the touch panel substrate of the fourth to sixth aspects, which can be configured such that a region where the first relay wiring line is formed is square.

A touch panel substrate according to a tenth aspect of the present invention is the touch panel substrate of the first to ninth aspects, which can be configured such that an even grid pattern is formed on the touch panel substrate by the first conductive lines and the second conductive lines.

A touch panel substrate according to an eleventh aspect of the present invention is the touch panel substrate of the first to tenth aspects, which can be configured such that among regions formed between the plurality of first grid electrodes and the plurality of second grid electrodes, the first relay wiring lines and the second relay wiring lines in a grid pattern are formed in a first region, and first extension grid wiring lines formed by extending some conductive lines of the grid pattern of the first grid electrodes and second extension grid wiring lines formed by extending some conductive lines of the grid pattern of the second grid electrodes are formed in a second region differing from the first region, such that an even grid pattern is formed on the touch panel substrate.

A display device according to a twelfth aspect of the present invention includes: the touch panel substrate according to any one of the first to eleventh aspects; and a display panel.

A display device of a thirteenth aspect of the present invention is the display device of the twelfth aspect, which can be configured such that a line in one direction of a grid of a black matrix formed on the display panel is parallel to the first direction and a line of the grid in another direction is parallel to the second direction.

The present invention is not limited to the embodiments described above, and various modifications can be made without departing from the scope of the claims. Therefore, embodiments obtained by appropriately combining the techniques disclosed in different embodiments are included in the technical scope of the present invention.

INDUSTRIAL APPLICABILITY

The present invention can be used for a display device having a touch panel functionality.

DESCRIPTION OF REFERENCE CHARACTERS 1 display device
2, 20, 30, 40 touch panel substrate
3 display panel
4 backlight
5 substrate
6 first electrode layer
7 second electrode layer
8 first protective layer
9 second protective layer
10 black matrix
11 first detection electrode
12 second detection electrode
13, 23, 33, 43 first grid electrode
14, 24, 34, 44 second grid electrode
15, 25, 35 region (first region)
16, 26, 36 relay wiring line (first relay wiring line)
17 conductive line (first conductive line)
18, 28, 38 relay wiring line (second relay wiring line)
19 conductive line (second conductive line)
39 region (second region)
46 extension grid wiring line (first extension grid wiring line)
48 extension grid wiring line (second extension grid wiring line)

What is claimed is:
1. A touch panel substrate, comprising:
a first detection electrode having a plurality of first grid electrodes each having a quadrilateral outer shape, the first grid electrodes being arranged in a first direction; and
a second detection electrode having a plurality of second grid electrodes each having a quadrilateral outer shape, the second grid electrodes being arranged in a second direction differing from the first direction,
wherein each of the first grid electrodes includes first conductive lines formed in a grid pattern such that sides of cells of the grid pattern are respectively parallel to sides of the quadrilateral outer shape of the first grid electrode,
wherein the first grid electrodes adjacent to each other in the first direction are electrically connected by a first relay wiring line formed therebetween,
wherein each of the first grid electrodes has two opposing corners forming a diagonal line generally extending in the first direction but inclined with respect to the first direction,
wherein each of the second grid electrodes includes second conductive lines formed in a grid pattern such that sides of cells of the grid pattern are respectively parallel to sides of the quadrilateral outer shape of the second grid electrode, wherein the second grid electrodes adjacent to each other in the second direction are electrically connected by a second relay wiring line formed therebetween, and wherein each of the second grid electrodes has two opposing corners forming a diagonal line generally extending in the second direction but inclined with respect to the second direction.

2. The touch panel substrate according to claim 1, wherein the first direction is perpendicular to the second direction.

3. The touch panel substrate according to claim 2, comprising:

a plurality of said first detection electrodes arranged in the second direction; and a plurality of said second detection electrodes arranged in the first direction, wherein a pitch of the plurality of first detection electrodes is the same as a pitch of the plurality of second detection electrodes, and wherein the quadrilateral outer shapes of the first grid electrodes and the second grid electrodes are square.

4. The touch panel substrate according to claim 1, wherein the quadrilateral outer shapes of the first grid electrodes and the second grid electrodes are diamond-shaped.

5. The touch panel substrate according to claim 1, wherein the quadrilateral outer shapes of the first grid electrodes and the second grid electrodes are square.

6. The touch panel substrate according to claim 5, wherein the first conductive lines are formed in a square grid pattern such that sides of cells of the grid pattern are respectively parallel to sides of the quadrilateral outer shape of each of the first grid electrodes, and wherein the second conductive lines are formed in a square grid pattern such that sides of cells of the grid pattern are respectively parallel to sides of the quadrilateral outer shape of each of the second grid electrodes.

7. The touch panel substrate according to claim 5, wherein a region where the first relay wiring line is formed is square.

8. The touch panel substrate according to claim 1, wherein one diagonal line of each of the first grid electrodes is inclined at an angle $\theta$ with respect to the first direction, and wherein another diagonal line of said each of the first grid electrodes is inclined at said angle $\theta$ with respect to the second direction.

9. The touch panel substrate according to claim 1, wherein the first detection electrode is formed in a first layer and the second detection electrode is formed in a second layer differing from the first layer.

10. The touch panel substrate according to claim 1, wherein an even grid pattern is formed on said touch panel substrate by the first conductive lines and the second conductive lines.

11. The touch panel substrate according to claim 1, wherein, among regions formed between the plurality of first grid electrodes and the plurality of second grid electrodes, the first relay wiring lines and the second relay wiring lines in a grid pattern are formed in a first region, and wherein first extension grid wiring lines formed by extending some conductive lines of the grid pattern of the first grid electrodes and second extension grid wiring lines formed by extending some conductive lines of the grid pattern of the second grid electrodes are formed in a second region differing from the first region, such that an even grid pattern is formed on said touch panel substrate.

12. A display device, comprising:

the touch panel substrate according to claim 1; and a display panel.

13. The display device according to claim 12, wherein a line in one direction of a grid of a black matrix formed on the display panel is parallel to the first direction and a line of said grid in another direction is parallel to the second direction.

* * * * *